(12) United States Patent
Sewell et al.

(10) Patent No.: US 8,709,908 B2
(45) Date of Patent: Apr. 29, 2014

(54) IMPROVING ALIGNMENT TARGET CONTRAST IN A LITHOGRAPHIC DOUBLE PATTERNING PROCESS

(75) Inventors: Harry Sewell, Ridgefield, CT (US); Mircea Dusa, Campbell, CA (US); Richard Johannes Franciscus Van Haren, Waalre (NL); Manfred Gawein Tenner, Eindhoven (NL); Maya Angelova Doytcheva, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 618 days.

(21) Appl. No.: 12/725,026

(22) Filed: Mar. 16, 2010

(65) Prior Publication Data
US 2010/0301458 A1  Dec. 2, 2010

Related U.S. Application Data

(60) Provisional application No. 61/161,915, filed on Mar. 20, 2009.

(51) Int. Cl.
  *H01L 21/76*  (2006.01)
(52) U.S. Cl.
  USPC ............ 438/401; 430/311; 430/327; 430/330
(58) Field of Classification Search
  USPC ..................... 430/311, 327, 330; 438/401
  See application file for complete search history.

(56) References Cited

U.S. PATENT DOCUMENTS

| | | |
|---|---|---|
| 4,707,059 A | 11/1987 | Ogura et al. |
| 5,838,450 A | 11/1998 | McCoy et al. |
| 5,859,439 A | 1/1999 | Nam et al. |
| 6,331,709 B1 | 12/2001 | Amemiya et al. |
| 6,590,657 B1 | 7/2003 | Summerer et al. |
| 6,605,816 B2 | 8/2003 | Sandstrom |
| 6,780,775 B2 | 8/2004 | Ning |
| 7,264,169 B2 | 9/2007 | Juds |
| 7,972,017 B2 | 7/2011 | Amako et al. |
| 8,455,162 B2 | 6/2013 | Gabor et al. |
| 2002/0182518 A1 | 12/2002 | Van Haren |
| 2003/0081719 A1 | 5/2003 | Ida et al. |
| 2004/0043328 A1* | 3/2004 | Lu ................................ 430/311 |

(Continued)

OTHER PUBLICATIONS

Du, Hai et al., "Technical and Software Note: PhotochemCAD: A Computer-Aided Design and Research Tool in Photochemistry," *Photochemistry and Photobiology*, American Society for Photobiology, vol. 68, No. 2, pp. 141-142, 1998.

(Continued)

*Primary Examiner* — Samuel Gebremariam
(74) *Attorney, Agent, or Firm* — Sterne, Kessler, Goldstein & Fox P.L.L.C

(57) ABSTRACT

A system and method of manufacturing a semiconductor device lithographically and an article of manufacture involving a lithographic double patterning process having a dye added to either the first or second lithographic pattern are provided. The dye is used to detect the location of the first lithographic pattern and to directly align the second lithographic pattern to it. The dye may be fluorescent, luminescent, absorbent, or reflective at a specified wavelength or a given wavelength band. The wavelength may correspond to the wavelength of an alignment beam. The dye allows for detection of the first lithographic pattern even when it is over coated with a radiation sensitive-layer (e.g., resist).

18 Claims, 19 Drawing Sheets

(56) References Cited

U.S. PATENT DOCUMENTS

Figure 1A:
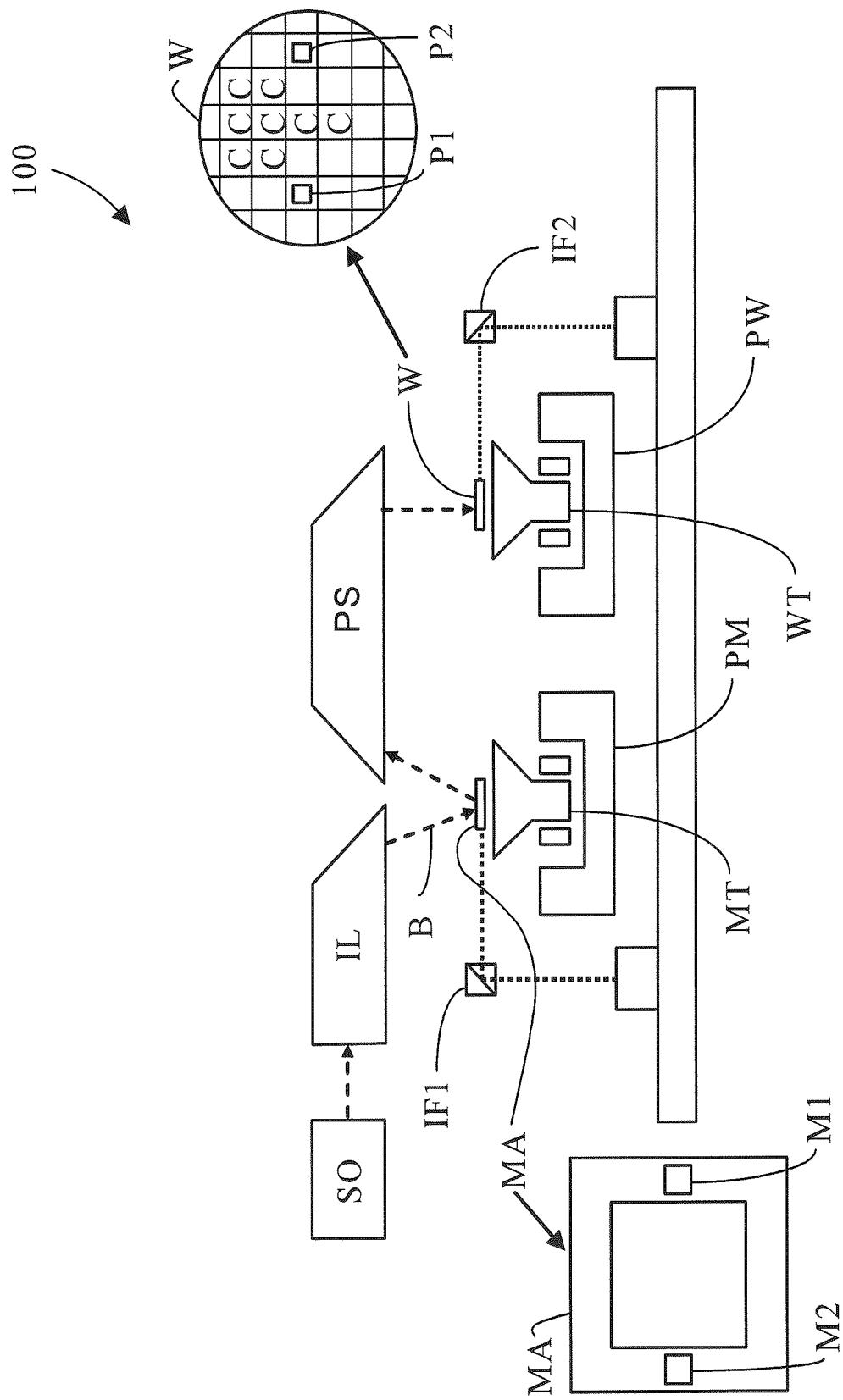

| | | |
|---|---|---|
| 2007/0077526 A1* | 4/2007 | Finders .................. 430/322 |
| 2007/0287075 A1 | 12/2007 | Pforr et al. |
| 2008/0002213 A1 | 1/2008 | Weiss |
| 2008/0078741 A1 | 4/2008 | Kotani |
| 2010/0103433 A1 | 4/2010 | Ausschnitt |
| 2011/0019173 A1 | 1/2011 | Vladimirsky et al. |
| 2011/0075238 A1 | 3/2011 | Sewell et al. |
| 2012/0021140 A1 | 1/2012 | Dijksman et al. |

OTHER PUBLICATIONS

Dixit, N.S et al., "Absorption and Emission Characteristics of Merocyanine 540 in Microemulsions," *Journal of the American Chemical Society*, vol. 105, No. 9, pp. 2928-2929, May 4, 1983.

Sims, Peter Jay et al., "Studies on the Mechanism by Which Cyanine Dyes Measure Membrane Potential in Red Blood Cells and Phosphatidylcholine Vesicles," *Biochemistry*, American Chemical Society, vol. 13, No. 16, pp. 3315-3330, Jul. 30, 1974.

Brokner-Christiansen, Mads et al., "Combined nanoimprint and photolithography of integrated polymer optics," IEEE/LEOS Summer Topical Meetings, Jul. 23-25, 2007, pp. 101-102.

Non-Final Rejection mailed Oct. 9, 2012 for U.S. Appl. No. 12/730,906, filed Mar. 24, 2010; 7 pages.

Final Rejection mailed May 31, 2013 for U.S. Appl. No. 12/730,906, filed Mar. 24, 2010; 12 pages.

Notice of Allowance mailed Sep. 12, 2013 for U.S. Appl. No. 12/730,906, filed Mar. 24, 2010; 10 pages.

* cited by examiner

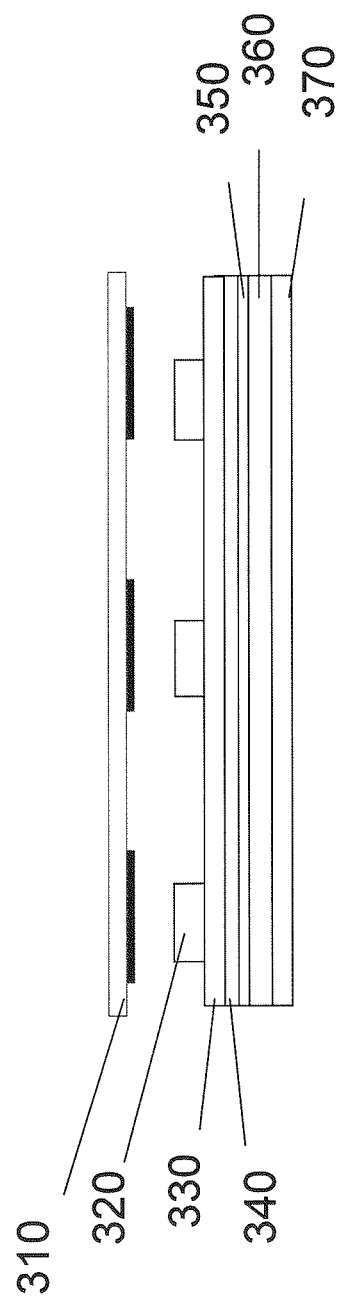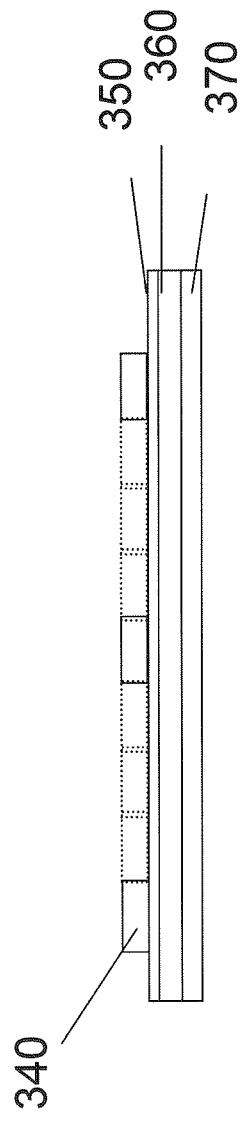

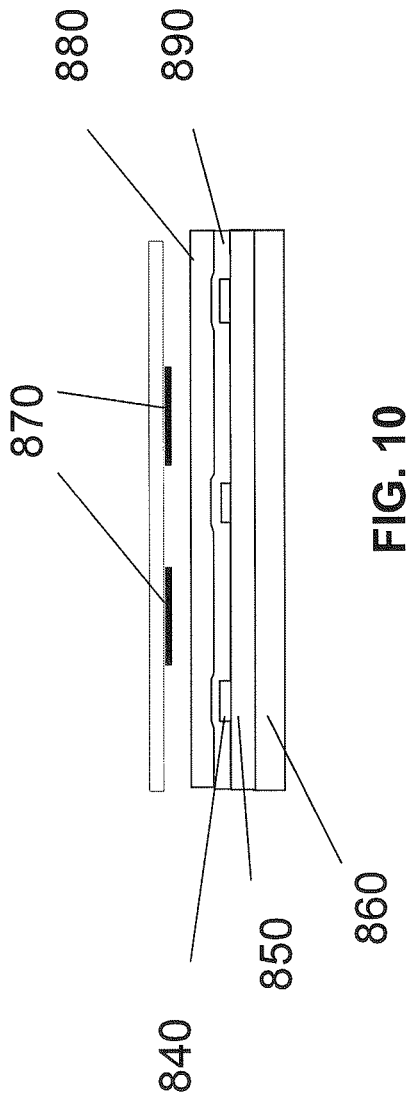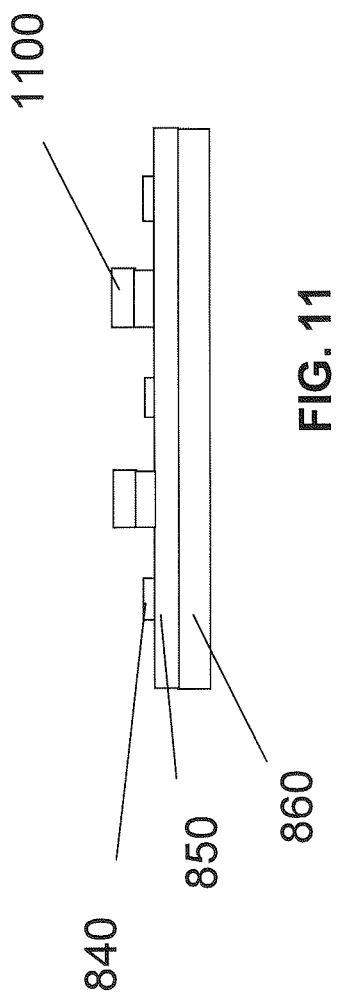

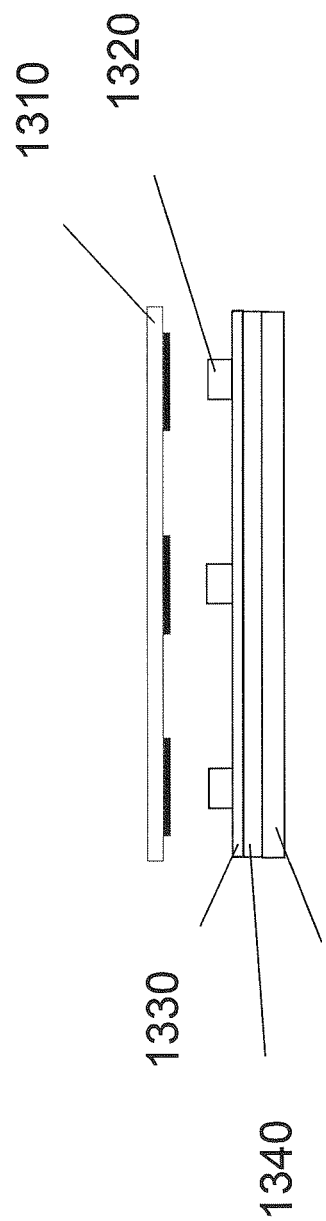
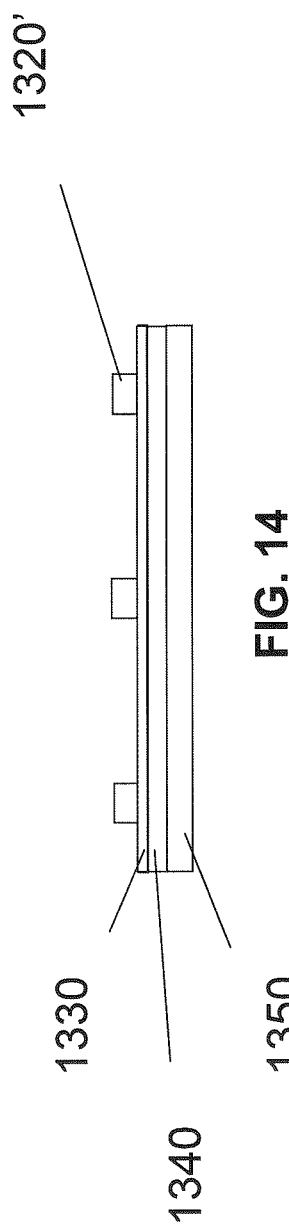

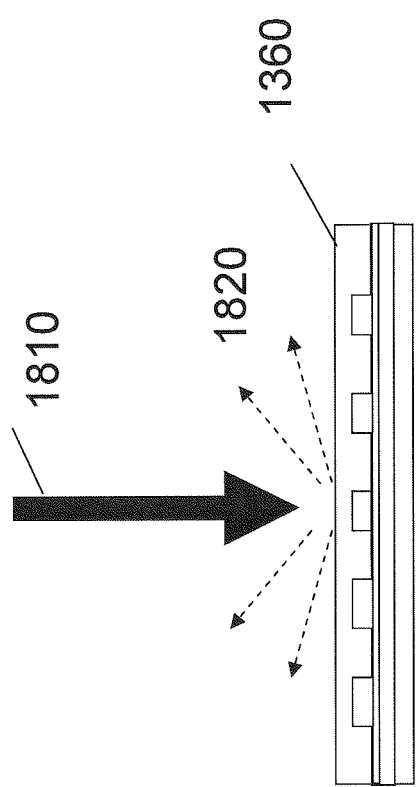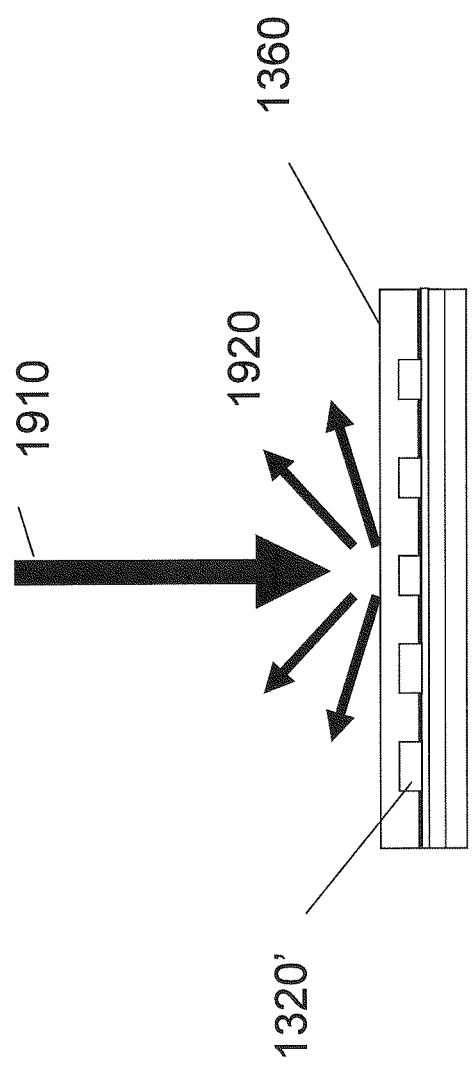

IMPROVING ALIGNMENT TARGET CONTRAST IN A LITHOGRAPHIC DOUBLE PATTERNING PROCESS

CROSS REFERENCE TO RELATED APPLICATIONS

This application claims the benefit under 35 U.S.C. §119(e) to U.S. Provisional Patent Application 61/161,915, filed Mar. 20, 2009, which is incorporated by reference herein in its entirety.

BACKGROUND

1. Field of the Invention

The present invention relates generally to lithography, and more particularly to improving alignment targets in lithographic patterning processes, such as a double patterning process.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction, also referred to as the "y-direction") while synchronously scanning the substrate parallel or anti-parallel to this direction. It is also possible to transfer the pattern from the patterning device to the substrate by imprinting the pattern onto the substrate.

The resolution of optical lithography can be increased by using double patterning. Double patterning generally involves two sets of patterns. The second set must be accurately aligned with the first set. In some cases, the two sets of patterns are aligned interstitially. Aligning these two sets poses a major challenge, especially as the semiconductor industry's demands pose increasing resolution and tighter overlay requirements.

SUMMARY

Embodiments of the present invention generally relate to improving alignment mark contrast in lithographic patterning processes such as a double patterning process.

In one embodiment of the present invention, a method of manufacturing a semiconductor device using lithography is provided. The method includes coating a substrate with a first radiation sensitive-layer and adding a dye compound to the first radiation-sensitive layer. The method further includes exposing and developing the first radiation-sensitive layer to form a first lithography pattern, coating the first lithography pattern with a second radiation-sensitive layer, detecting the location of the first lithography pattern, aligning the substrate with the detected location of the first lithography pattern, and exposing and developing the second radiation-sensitive layer to form a second lithography pattern. The method aligns the second lithography pattern with the detected location of the first lithography pattern. In one exemplary implementation, the dye compound and the first lithography pattern form a diffraction grating, diffraction array, alignment array, or other pattern for alignment.

In another embodiment of the present invention, a method includes coating a substrate with a first radiation sensitive-layer, exposing and developing the first radiation-sensitive layer to form a first lithography pattern, and coating the first lithography pattern with a second radiation-sensitive layer. The method further includes adding a dye compound to the second radiation-sensitive layer, detecting the location of the first lithography pattern, aligning the substrate with the detected location of the first lithography pattern, and exposing and developing the second radiation-sensitive layer to form a second lithography pattern. The method includes aligning the second lithography pattern with the detected location of the first lithography pattern. In one exemplary implementation, the dye compound and the second lithography pattern form a diffraction grating, diffraction array, alignment array, or other pattern for alignment.

The present invention also relates to an article of manufacture including: a substrate coated with a first radiation-sensitive layer; a first lithography pattern formed in the first radiation-sensitive layer; and a second radiation-sensitive layer coating the first radiation-sensitive layer. Either the first lithography pattern or the second radiation-sensitive layer includes a dye compound. The dye compound cooperates with either the first lithography pattern or the second radiation-sensitive layer to form a diffraction grating, diffraction array, alignment array, or other pattern for alignment. In one exemplary implementation, the article of manufacture further includes a second lithography pattern directly aligned to the first lithography pattern using the diffraction grating, diffraction array, alignment array, or other pattern for alignment.

The present invention also relates to a system for manufacturing a semiconductor device lithographically. The system includes an illumination source to provide an alignment beam at a specified wavelength for reading an alignment mark in a double patterning process. The system also includes an alignment system to detect a dye compound in one of a first radiation-sensitive layer coated on a substrate or in a second radiation-sensitive layer coated on a first lithography pattern in the double patterning process. The dye compound provides a desired contrast between the first lithography pattern and the second radiation-sensitive layer when aligning two patterning steps of the double patterning process based on the alignment mark formed in the first lithography pattern.

BRIEF DESCRIPTION OF THE DRAWINGS/FIGURES

The above summary sets forth many, but not all aspects of the invention. Other aspects of the invention should be apparent to those skilled in the art to which the invention pertains by reading the descriptions of various "embodiments" of the invention in conjunction with reference to the drawings. In setting forth the following embodiments, the present invention is illustrated by way of example, and not by way of limitation. In the figures, like reference numerals refer to similar elements.

Figure 1B:
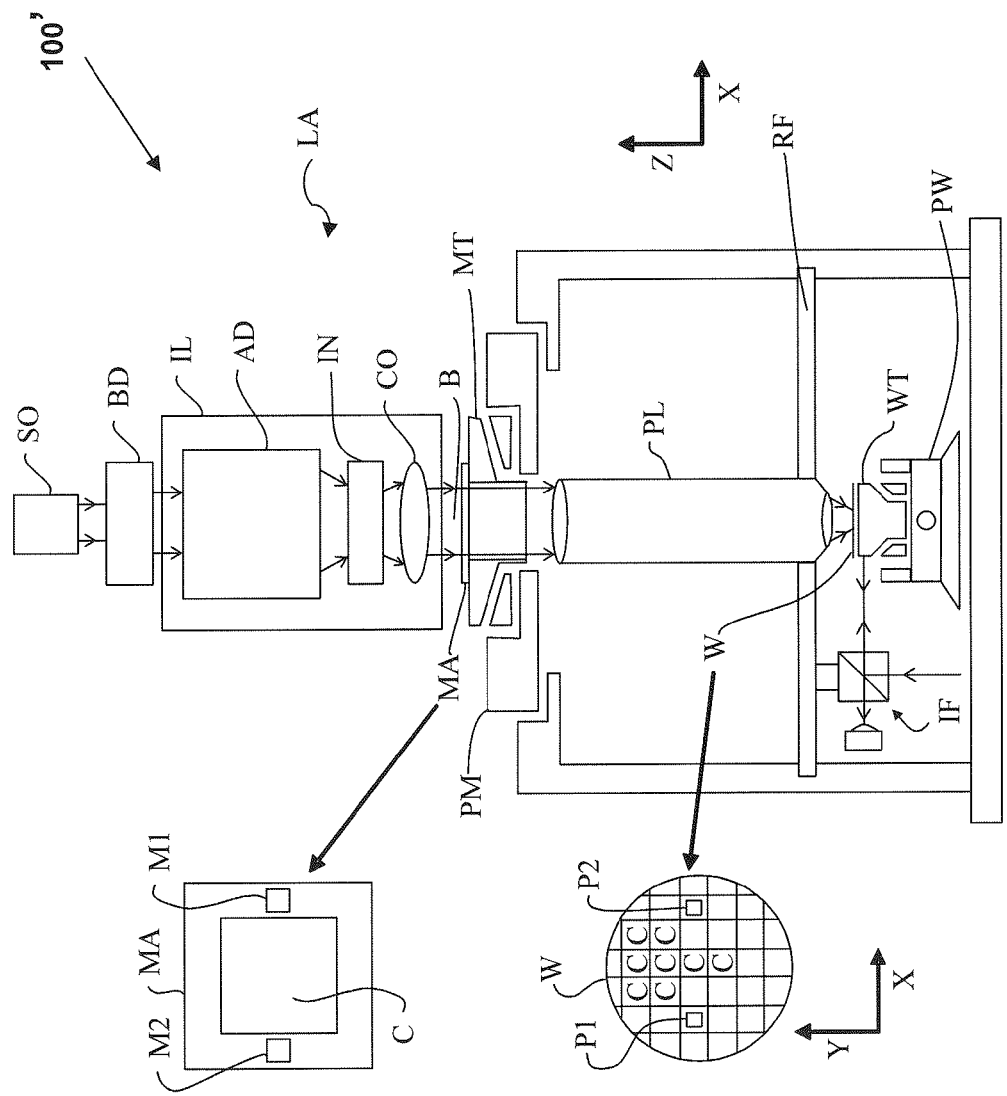
Figure 2:
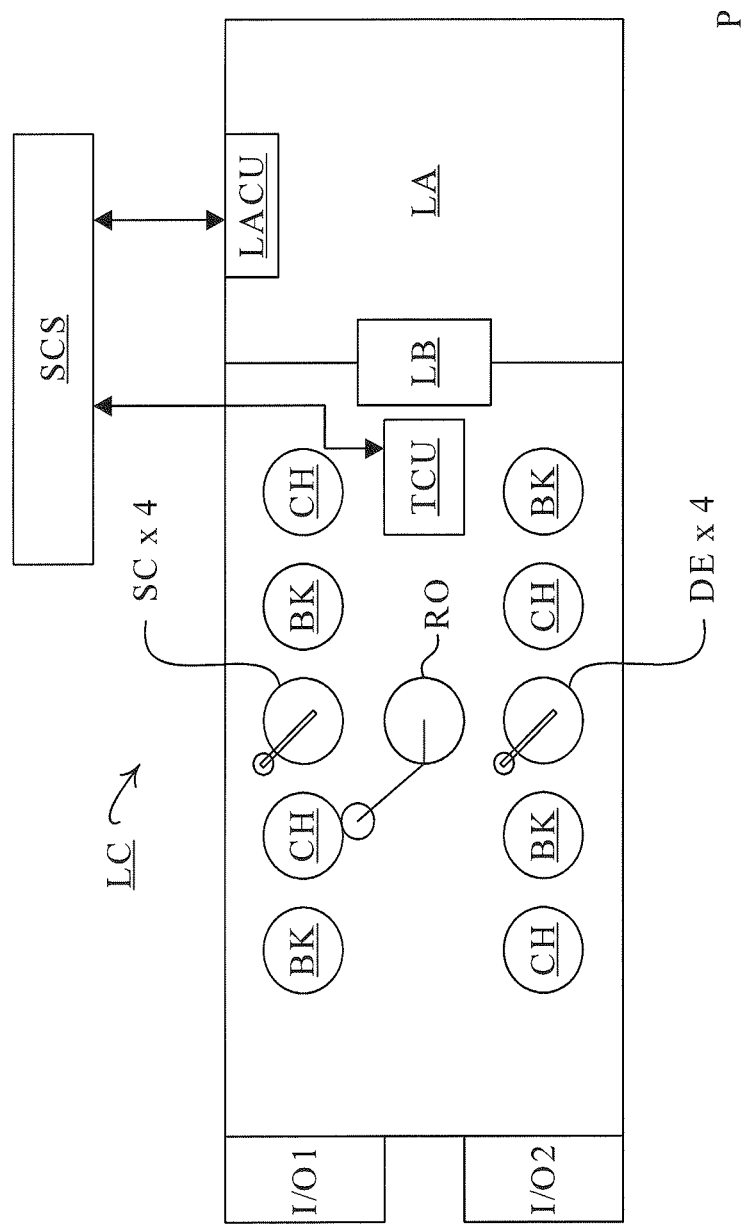
Figure 7:
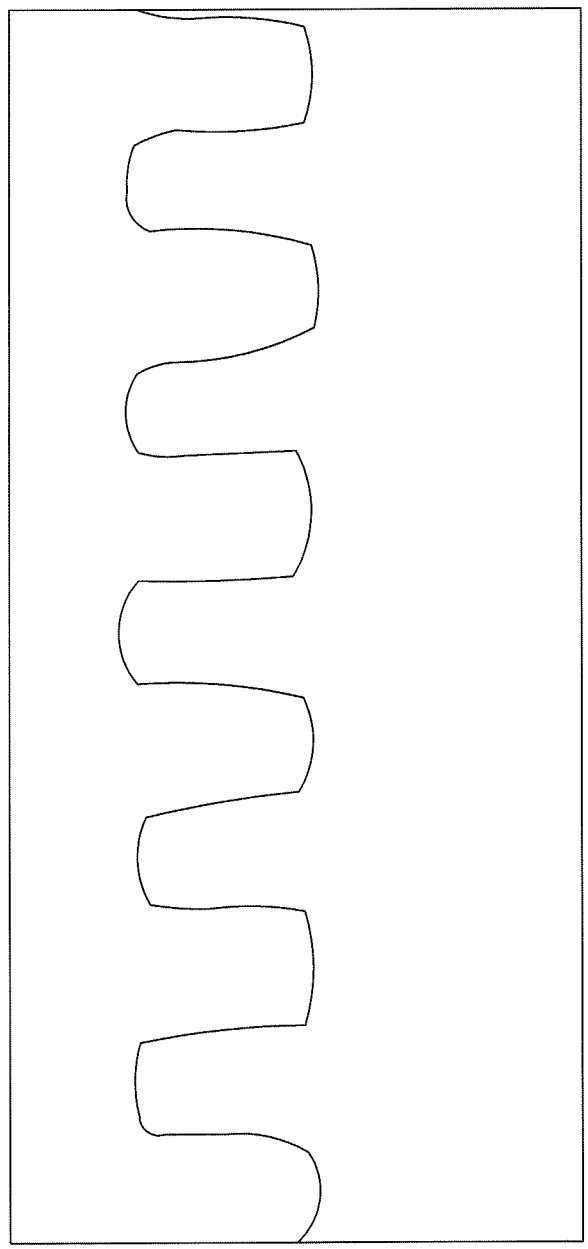
Figure 12:
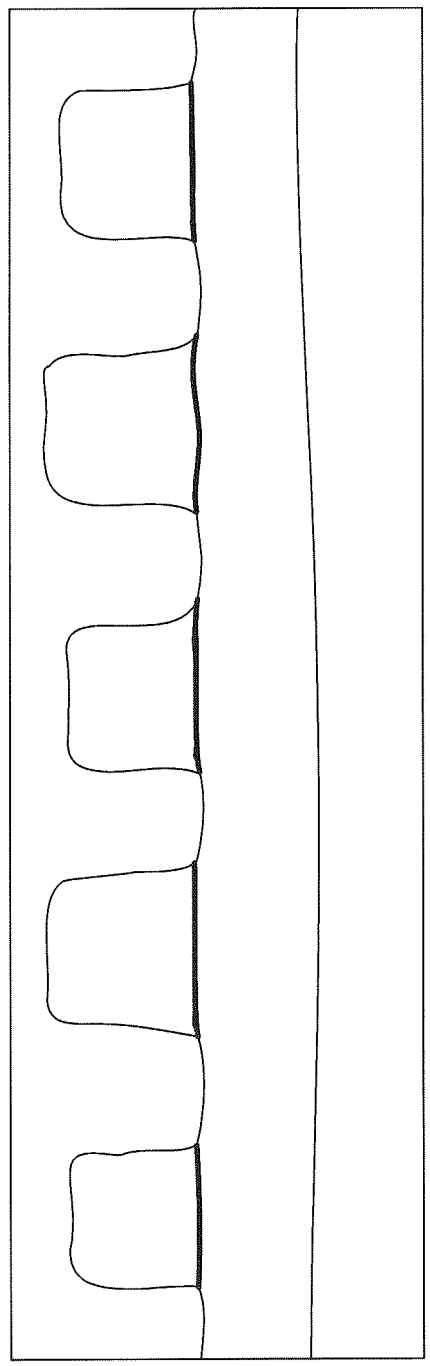
Figure 17:
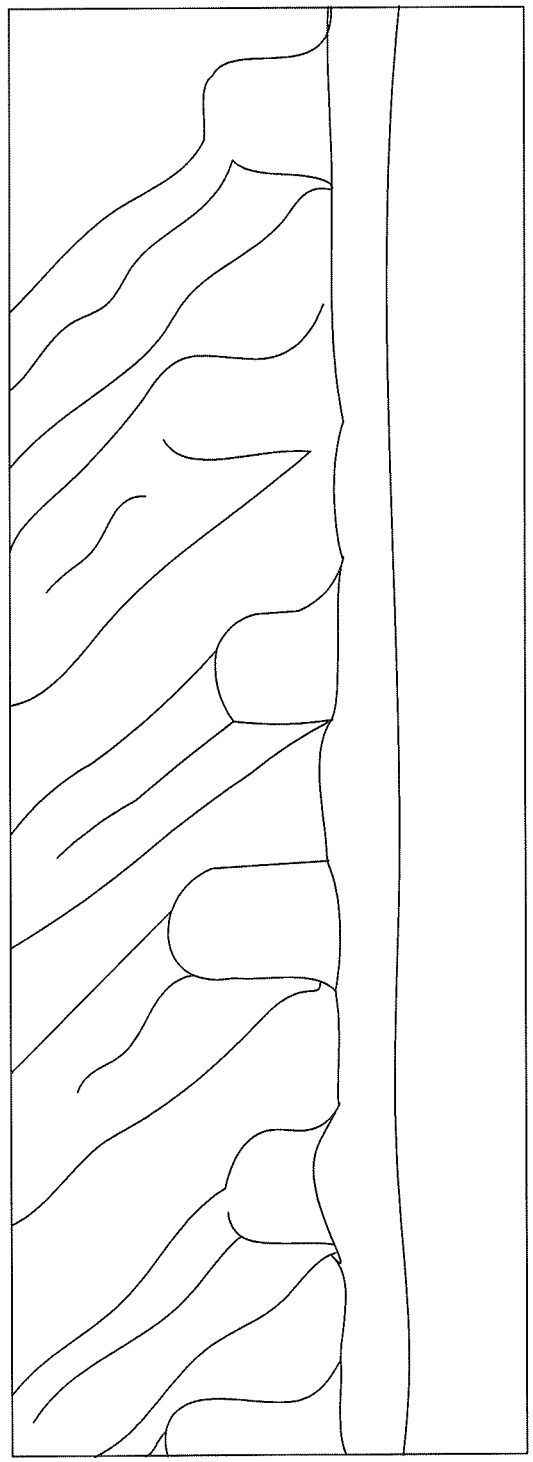
Figure 20:
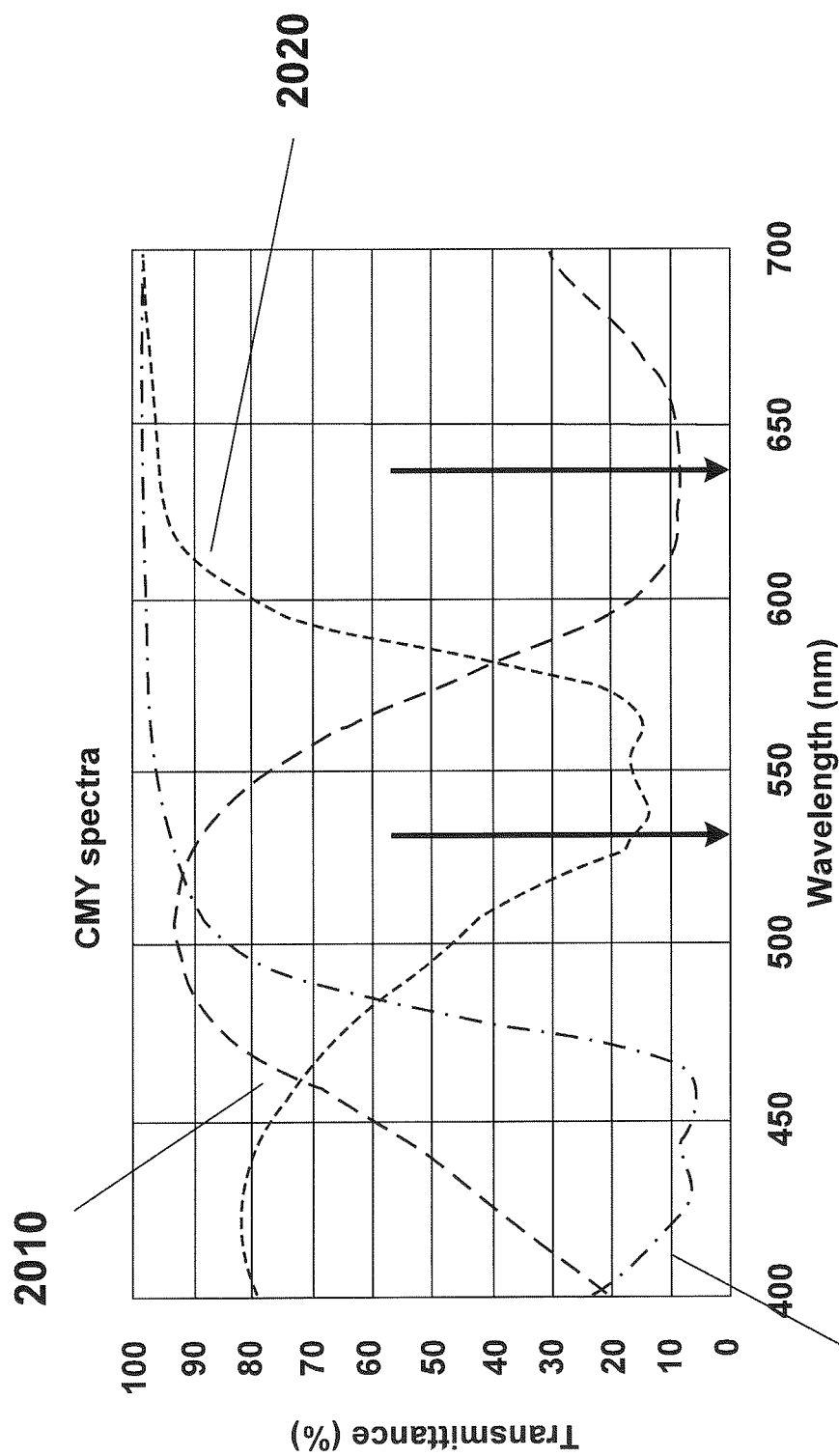
Figure 21:
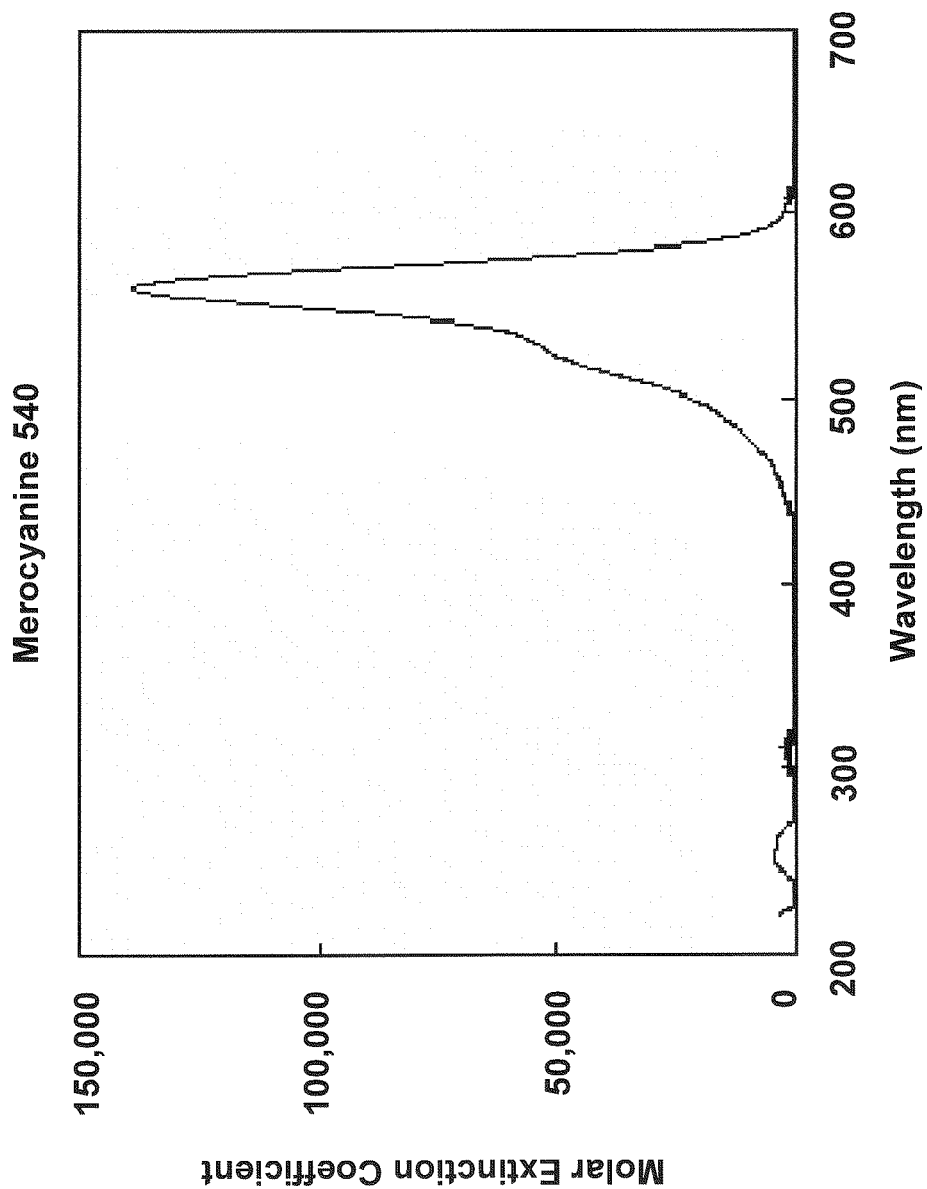
Figure 22:
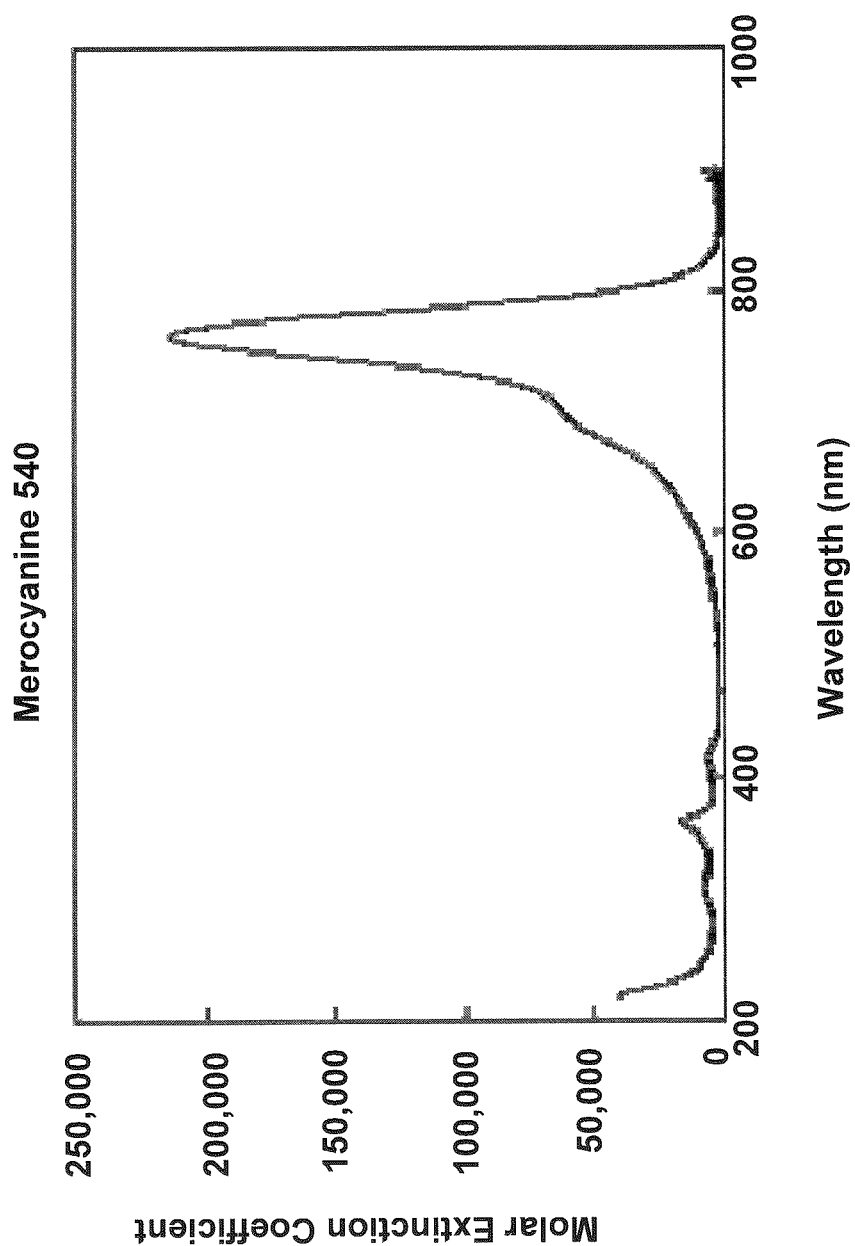
Figure 23:
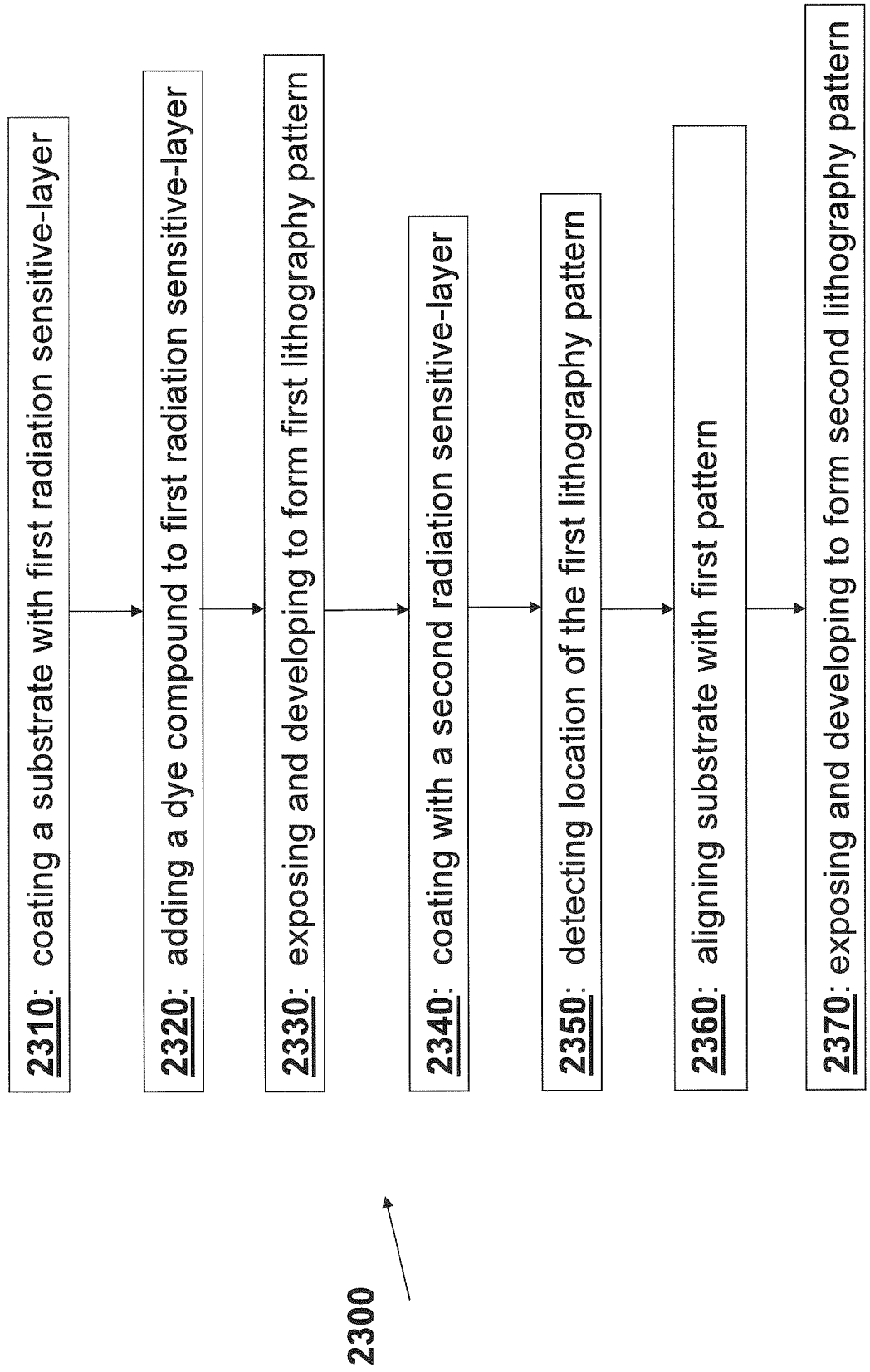
Figure 24:
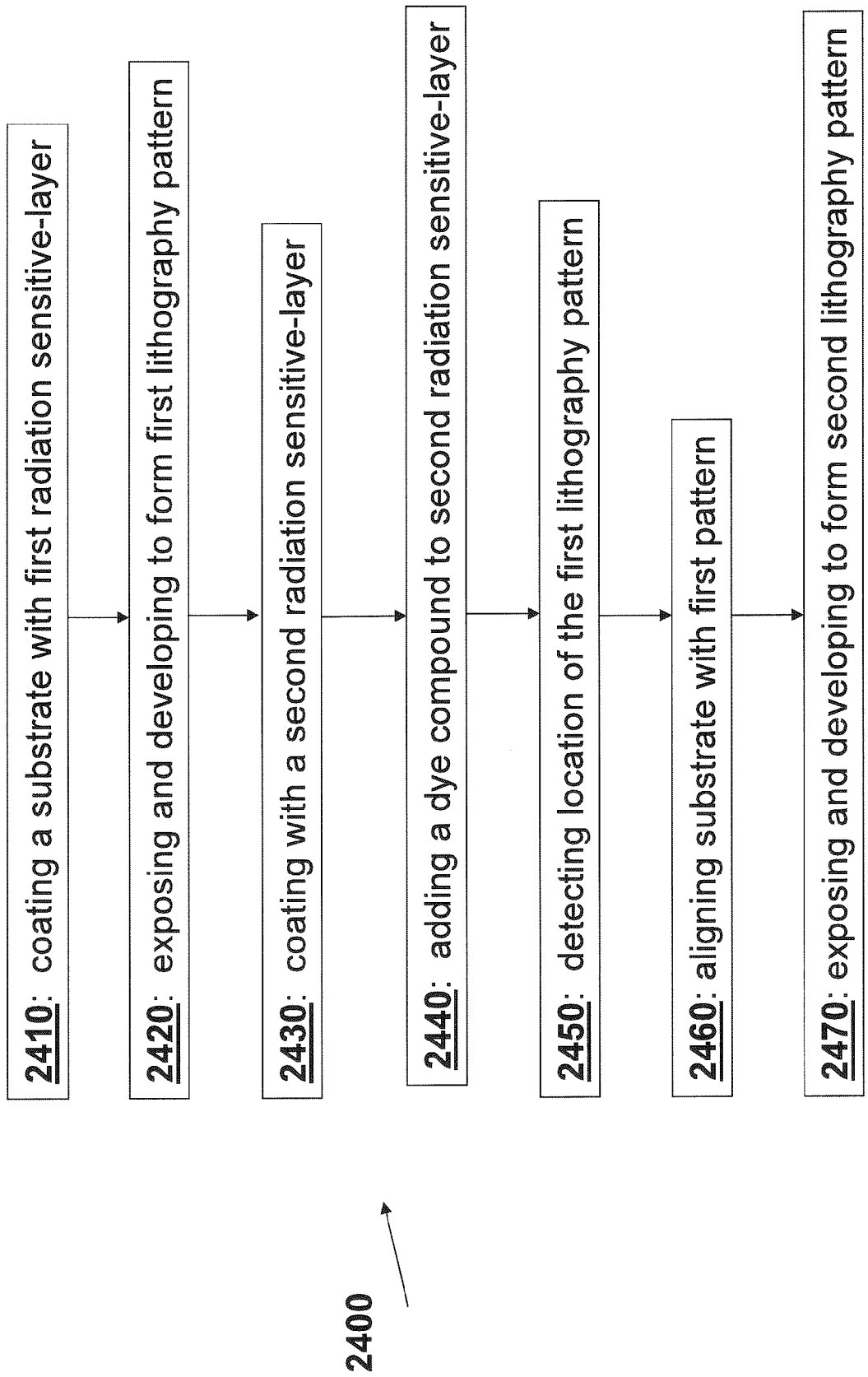
Figure 25:
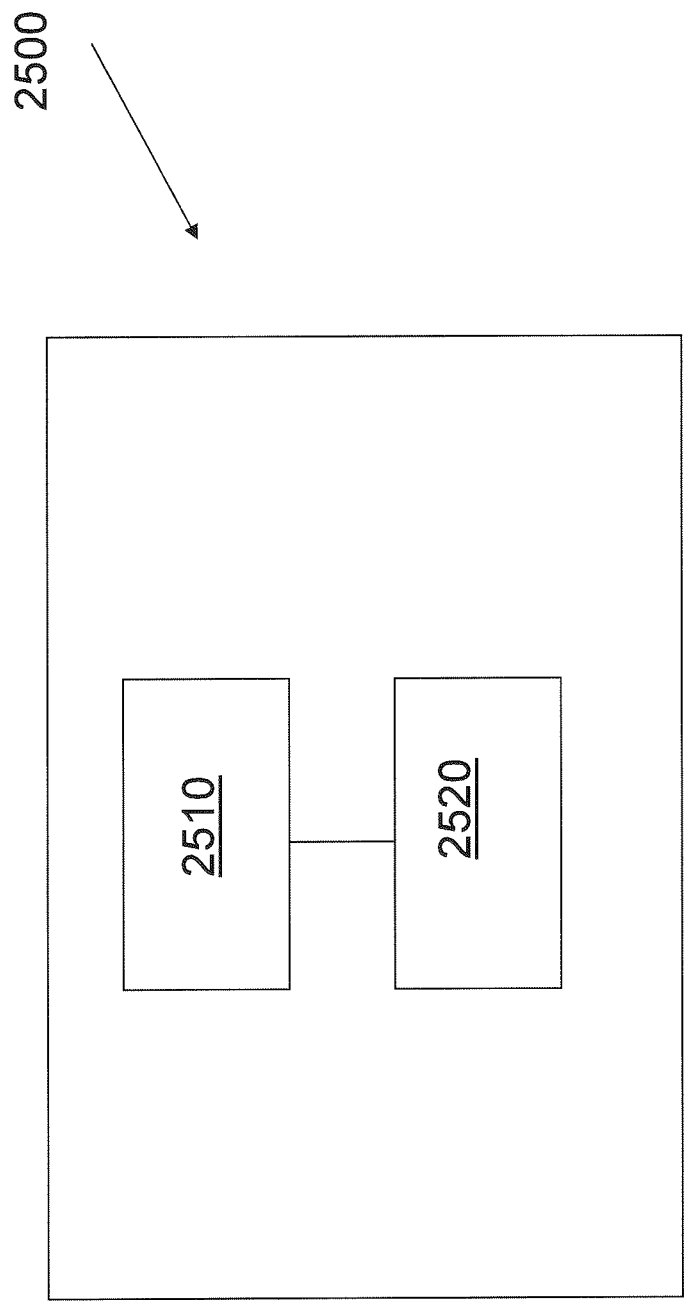

FIGS. 1A and 1B respectively depict reflective and transmissive lithographic apparatuses, according to one embodiment of the present invention;

FIG. 2 schematically shows a lithographic cell, according to one embodiment of the present invention;

FIGS. 3-6 schematically show steps in a spacer double patterning process, according to one embodiment of the present invention;

FIG. 7 schematically shows a SEM profile in polysilicon resulting from a spacer double patterning process, according to one embodiment of the present invention;

FIGS. 8-11 schematically show steps in a Litho Etch Litho Etch (LELE) double patterning process, according to one embodiment of the present invention;

FIG. 12 schematically shows a SEM profile in polysilicon resulting from a LELE double patterning process, according to one embodiment of the present invention;

FIGS. 13-16 schematically show steps in a Litho Freeze Litho Etch (LFLE) double patterning process, according to one embodiment of the present invention;

FIG. 17 schematically shows a SEM profile in polysilicon resulting from a LFLE double patterning process, according to one embodiment of the present invention;

FIG. 18 schematically shows an alignment beam incident on a double patterning stack, according to one embodiment of the present invention;

FIG. 19 schematically shows an alignment beam incident on a double patterning stack augmented with dye, according to one embodiment of the present invention;

FIG. 20 schematically shows an exemplary transmission spectrum for photoresist augmented with colored dyes, according to one embodiment of the present invention;

FIG. 21 schematically shows the molar extinction coefficient spectrum for Merocyanine 540, according to one embodiment of the present invention;

FIG. 22 schematically shows the molar extinction coefficient spectrum for Thiatricarbocyanine (C7) dye, according to one embodiment of the present invention;

FIG. 23 schematically shows a flow chart depicting an embodiment of a method of manufacturing according to the present invention;

FIG. 24 schematically shows a flow chart depicting another embodiment of a method of manufacturing according to the present invention; and FIG. 25 schematically shows a block diagram of a system for manufacturing, according to one embodiment of the present invention.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Likewise, the drawings showing embodiments of the system are semi-diagrammatic and schematic and are not drawn to scale. Some of the dimensions are exaggerated for the clarity of presentation.

Apparatus illustrated can be operated in orientations other than as illustrated. In addition, where multiple embodiments are disclosed and described having some features in common, for clarity and ease of illustration, description, and comprehension thereof, similar and like features one to another will ordinarily be described with like reference numerals.

FIGS. 1A and 1B schematically depict lithographic apparatus 100 and lithographic apparatus 100', respectively, consistent with embodiments of the present invention. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons.

A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g., so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Combinations and/or variations on the above described modes of use or entirely different modes of use may also be employed.

Consistent one embodiment of the present invention, as shown in FIG. 2, the lithographic apparatus LA forms part of a lithographic cell LC, sometimes referred to as a lithocell or cluster, which also includes apparatus to perform pre- and post-exposure processes on a substrate. In one example, a lithocell or cluster may include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU, which is itself controlled by the supervisory control system SCS, which also controls the lithographic apparatus via lithography control unit LACU. Thus, the different apparatus can be operated to maximize throughput and processing efficiency.

Optical Lithography has met the challenge of the semiconductor industry's increasing resolution and the tighter overlay requirements by progressively: increasing the optics numerical aperture; shortening the illumination wavelength; and supporting low k-factor processing. This trend continued with the wavelength being shortened to 13 nm for EUV lithography tools, and with numerical apertures increased to 1.35 for water-based immersion lithography tools.

Currently, water-based, 193 nm, immersion tools are capable of printing at less than 40 nm (half pitch) resolutions with less than 6 nm overlay accuracy. For the next lithographic nodes, water-based immersion lithography will be used with double patterning techniques, and this will push-down to below the 32 nm node. The major challenges for the exposure tools are the tightening of the specifications required with double pattering, while dealing with shrinking process windows. The specifications requirements include increased throughput, tighter overlay, and tighter critical dimension control.

Optical lithography has been the mainstay of semiconductor device production for the past 30 years. It has kept up with the exacting resolution requirements of the semiconductor industry roadmap by progressively increasing optical system numerical apertures and using progressively shorter exposing illumination wavelengths.

Occasional roadblocks have been circumvented by the introduction of new techniques. An example of this was the introduction of immersion lithography, which, as discussed above allowed the increase of optical system numerical apertures to beyond the limit of 1.0. Using water as an immersion fluid between the lens and the wafer has allowed the optics system numerical aperture to be increased to 1.35. This represented the new limit imposed by refractive indices in the imaging layer stack. The maximum numerical aperture is limited to the product of the minimum refractive index in the layer stack and the sine of the maximum ray angle. For water-based immersion, the limiting refractive indices in the thin film stack are that of the water, at 1.44, and the lens's final element glass, at 1.56. This gives a maximum numerical aperture of 1.35, i.e., 0.94×1.44, where 0.94 is the sine of the maximum practical imaging ray angle (70 degrees). Changing the immersion fluid and the final lens element glass to increase the minimum refractive index in the layer stack represents significant technical challenges and cannot be accomplished in the timeframe of the required lithography roadmap and before the availability of production EUV lithography. The half pitch resolution of an immersion optical system is given by:

$$Rs = k\frac{\lambda}{NA}$$

Where: Rs is the half pitch resolution; λ is the illumination wavelength; NA is the optics system numerical aperture; and k is the process factor associated with the configuration and partial coherence of the illumination. The minimum value of k is 0.25 and is associated with using Dipole Illumination.

The highest optical half pitch resolution available therefore becomes 36 nm for water-based immersion, numerical aperture 1.35, using polarized dipole illumination at a wavelength of 193 nm. Clearly, for optical lithography to capture 32 nm (half pitch) node lithography and beyond, some further innovation is required. "Double Patterning" represents such a step and is under development.

Double patterning can now be grouped into three main processing techniques: Spacer based double patterning; Litho Etch Litho Etch (LELE) based double patterning; and Litho Process Litho Etch (LPLE) based double patterning. One example of LPLE is Litho Freeze Litho Etch (LFLE) based double patterning. In development, all of these processes are giving promising results. The Spacer technique is particularly applicable to Flash Memory production.

A basic spacer double patterning sequence consistent with one embodiment of the present invention is shown in FIGS. 3-6. FIGS. 3-4 depict the first steps in the spacer sequence, which are to lithographically define a resist pattern (shown in FIG. 3) that is then transferred by etch into a sacrificial (as shown in FIG. 4). In FIG. 3, a patterning device 310 is shown above a lithography pattern 320 (resist) atop a bottom anti-reflective coating (barc) layer 330. In an earlier step (not shown), pattern 320 was formed by exposing and developing a layer of resist. The rest of the stack comprises a sacrificial layer 340, hard mask layer 350, electric layer 360, and oxide layer 370. In one embodiment, sacrificial layer 340 comprises an advanced patterning film (APF), from Applied Materials of Santa Clara, Calif.

Consistent with one embodiment of the present invention, FIG. 4 depicts the lithography pattern 320 (not shown in FIG. 4) from FIG. 3 being transferred to the sacrificial layer 340 by etch.

Figure 5:
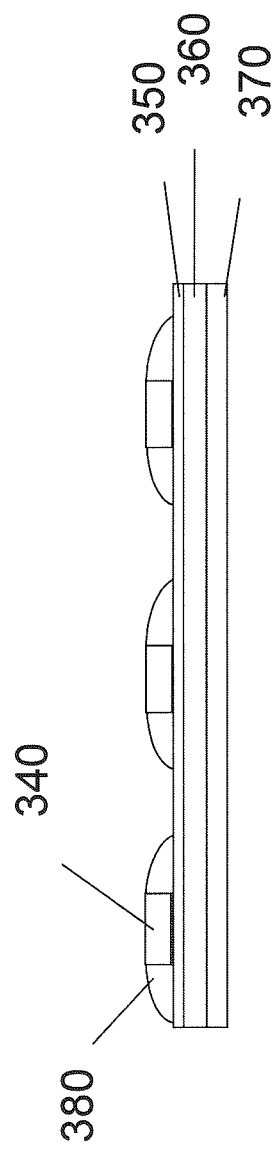
Figure 6:
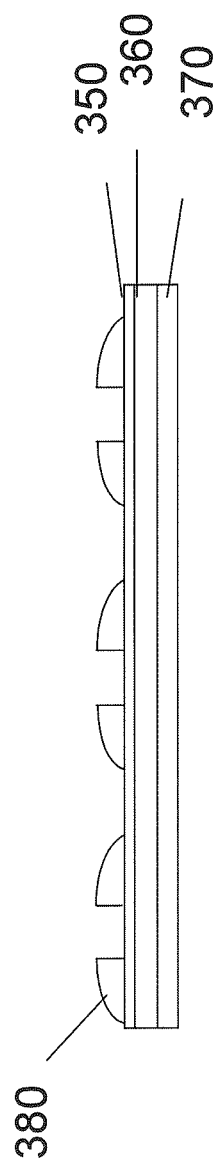

Consistent with one embodiment of the present invention, FIG. 5 shows the spacer-forming layer 380 being conformally deposited over the etched hard mask pattern 350 and then anisotropically etched back to leave the spacer pattern that follows all edges of the initial lithographically defined sacrificial pattern. The initial sacrificial pattern 340 is then etched away (see FIG. 6) to leave the high resolution spacer pattern.

This spacer pattern is then subjected to a second lithography stage to etch and to trim away unwanted parts of the spacer patterning, leaving the required high resolution final pattern (not shown). The final defined high resolution spacer pattern is then etch transferred into a hard mask layer which is used to define the etching of the underlying polysilicon layer (not shown). A typical resulting scanning electron microscope (SEM) profile in polysilicon is shown in FIG. 7.

This spacer technology has become popular because the high resolution in linewidth is achieved, not by optical imagery, but by the control of a deposited layer thickness. This avoids increasing the resolution and overlay requirements on the optical exposure tool. The main requirement on the optical exposure tool becomes not resolution or overlay, but critical dimension uniformity and critical dimension control. The control of the critical dimension impacts the width of the gaps between the defined spacer linewidths. If the critical linewidth dimensions of the sacrificial pattern defined by the lithography tool are not correct, a bi-modal distribution in the measured space width develops.

Figure 8:
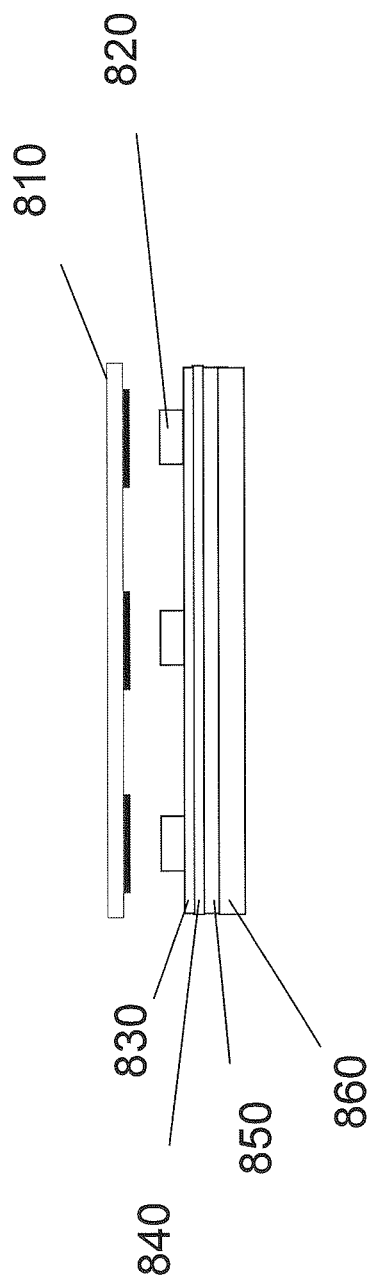

Consistent with one embodiment of the present invention, a basic Litho Etch Litho Etch (LELE) process sequence is shown in FIGS. 8-11. In LELE, two lithographically defined patterns are interstitially exposed in two processing sequences. As shown in FIG. 8, a patterning device 810 is shown above the stack. At the top of the stack is a first lithography pattern 820 (resist) on top of a barc layer 830. The rest of the stack comprises hard mask layer 840, polysilicon layer 850, and finally silicon dioxide ($SiO_2$) layer 860.

Figure 9:
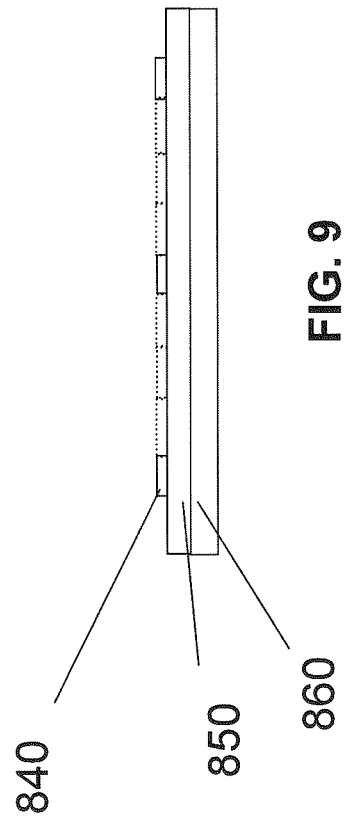

Consistent with one embodiment of the present invention, FIGS. 8-9 show the printing of the first lithography pattern 820 into resist and then the transfer to hard mask layer 840 by etch. A 1:1 line space type pattern is overexposed to a 1:3 line/space ratio that gives optimum process control and opens the spaces to allow insertion of a second lithography pattern.

Consistent with one embodiment of the present invention, FIG. 10 shows the imaging of the second interstitial pattern 870 and its definition in resist 880, which is above another barc layer 890. The pattern is also overexposed to give a 1:3 line/space ratio. Next, the second litho pattern is developed to define a resist/barc pattern 1100. Finally, both the first pattern 840, which is defined in the hard mask layer, and the second pattern 1100, which is defined in the resist layer, are transferred by etch into a polysilicon device layer (not shown).

The SEM profile in FIG. 12 shows typical line profiles that are defined in the polysilicon. The height difference between the lines is due to the difference in etching characteristics of the hard mask and the resist image defining patterns (hard mask not removed from first pattern).

For this technique, the exacting requirements on the exposure tool become both overlay and critical dimension uniformity. Using the "positive" LELE process flow illustrated in FIGS. 8-11, the overlay control defines the dimension uniformity of the spacing between lines, which may not be as critical to the device processing as the actual width of the lines that are used to define gate structures. The critical dimension control for the final polysilicon linewidths is the most important requirement; this is defined by the exposure tool. If the critical dimensions for the first and second patterns are not matched, a bi-modal linewidth distribution can be observed.

The latest and most exciting development are the LPLE processes. An example is the Freeze Process (also known as Litho Freeze Litho Etch, LFLE). LPLE processes reduce the number of processing steps in the LELE sequence. The first etch in the LELE process is not required. This implies a potential cost saving and yield improvement. The LFLE sequence is shown in FIGS. 13-16.

Consistent with one embodiment of the present invention, FIG. 13 shows the definition of the first lithography pattern similar to the LELE process. FIG. 13 shows patterning device 1310 above the first lithography pattern (made of resist) 1320, which has already been exposed and developed. Resist 1320 is on top of barc layer 1330, which is on top of polysilicon layer 1340. At the bottom of the stack is a layer of SiO.sub.2 1350.

In the next step, consistent with one embodiment of the present invention, as shown in FIG. 14, instead of etching pattern 1320 into a hard mask, the resist patterning is frozen in place so that it can be overcoated by the next resist coat for the definition of the second pattern in resist without being dissolved away. The frozen resist pattern is depicted as 1320'. The freezing of the resist pattern can be accomplished in a number of ways; these include: Ion Implant; DUV Exposure Hardening; Chemical Hardening, and the like. Chemical hardening promises to be the most economic and convenient.

Figure 15:
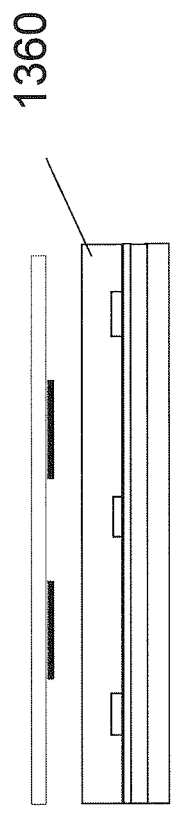
Figure 16:
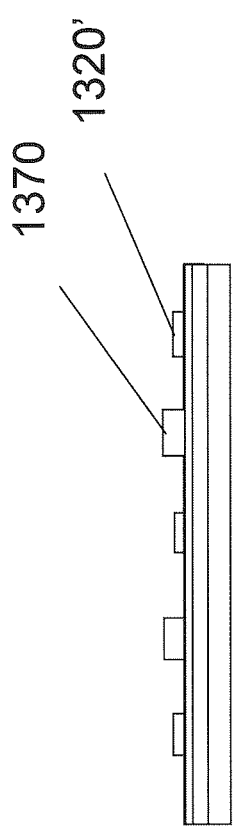

In FIG. 15, consistent with one embodiment of the present invention, the process continues with the resist overcoating 1360. Consistent with one embodiment of the present invention, FIG. 16 shows the definition of the second pattern 1370 in resist. Both the first 1320' and second images 1370 have been defined in resist, and are ready for etch transfer into the polysilicon 1340. The resulting SEM profile in polysilicon is show in FIG. 17, according to one embodiment of the present invention.

The LFLE process offers the same challenges for the exposure tool as does the LELE process. Using the "positive" sequence in which the patterning light exposes spaces, the overlay errors from the imaging appear as variations in the width of the spaces between lines. Poor overlay control will provide a bi-modal distribution in the width of the spaces. The critical dimension (CD) control and uniformity of each separate exposure step also contributes to a bi-modal distribution in the linewidth variation. With all the double patterning sequences highlighted, the challenge for the exposure tool becomes tight critical dimension and overlay specifications coupled with high productivity.

One major obstacle involved with double patterning techniques is accurately aligning the first lithography pattern to the second lithography pattern. In one embodiment, the first pattern is aligned interstitially with the second pattern, although this is not always the case. To demonstrate these concerns, the LFLE process is discussed in more detail below as one example. Referring back to FIGS. 14-16, the first lithography pattern 1320' is coated with a second radiation-sensitive layer (resist layer) 1360 to accommodate second lithography pattern 1370. An alignment mark defined in, for example, the first radiation-sensitive layer 1320, is obliterated, contrast-wise, when overcoated with second radiation-sensitive layer 1360 because they have similar optical properties. Therefore, the alignment mark in the resist cannot be seen by the alignment system.

In FIG. 18, arrow 1810 represents an alignment system illumination beam incident on the second resist layer 1360. Dashed arrows 1820 represent a very weak scattered signal from the buried alignment key. Normally, this would force the use of an alignment mark defined by a previous processing level (i.e., lower in the alignment key stack) for alignment of both the first pattern and subsequently the second pattern. Therefore, the two patterns are not directly aligned to one another, but rather they are independently aligned through a surrogate. This effectively degrades the alignment accuracy between the patterns. This is already a major problem, and will become even more problematic as the line spacing width continues to decrease.

Consistent with one embodiment of the present invention, one solution to the problem set forth above is providing a means of highlighting the definition of the patterned alignment mark (e.g., a diffraction grating, diffraction array, alignment array, or other pattern for alignment) in the first pattern of a double patterning process (e.g., LFLE) when the alignment mark is over-coated with resist. To this end, in the double patterning process steps a dye compound can be added before, together with, or after the first resist layer is exposed and developed. For example, a dye compound that does not appreciably interfere with the resist layer's actinic performance or, in the case of LFLE, its ability to freeze the image, could be used.

In one embodiment, the dye compound is a photosensitive compound or a photochromic material, as discussed in detail below. In one embodiment, the dye compound may be substantially absorbent or substantially reflective at a desired wavelength band. In another embodiment, the dye compound may be fluorescent or luminescent at a desired wavelength band. This wavelength band may include the alignment system illumination beam wavelength. In all of these embodiments, a diffraction grating, diffraction array, alignment array, or patterning used for alignment is formed. This diffraction grating, diffraction array, alignment array, or pattern is detectable by the alignment system.

Consistent with one embodiment of the present invention, in FIG. 19, arrow 1910 represents an alignment system illumination beam incident on the second resist layer 1360. In this illustrated embodiment, the first pattern 1320' has been augmented by a dye compound. Arrows 1920 represent a strong signal (e.g., diffraction orders) from the buried alignment key, which is now visible even though the first pattern is overcoated with the second resist layer 1360. As shown, the dye compound is applied to the first lithographic pattern 1320'. In another embodiment, a suitable dye compound may be applied to the second radiation-sensitive layer 1360. In either of these embodiments however, the dye compound provides an optical contrast between a first lithography pattern and a second resist layer that coats it. This contrast forms a diffraction grating, diffraction array, alignment array, or other pattern depending on the geometry of the pattern of an alignment mark used in the first patterning process of a double patterning process.

In one embodiment, the dye compound is added to the first resist layer (or first lithography pattern). The dye compound and the first resist layer (or first lithography pattern) cooperate to form a diffraction grating, diffraction array, alignment array, or other pattern for alignment. In another embodiment, the dye compound is added to the second resist layer which is coating the first pattern (instead of adding it to the first resist layer or first lithographic pattern). In this embodiment, the second resist layer (overcoating the first pattern) and the dye compound therein cooperate to form a diffraction grating, diffraction array, alignment array, or other pattern for alignment. In either of these embodiments, the diffraction grating, diffraction array, alignment array, or other pattern for alignment arises from interspersing the dye compound with areas lacking dye compound. In one embodiment, the dye compound is a photoactive photosensitive compound or a photochromic material.

Dyes can be selected to match the alignment system wavelengths. These dyes can be added to the first layer of resist in a double patterning process, or can be applied to the developed lithographic pattern. In another embodiment, the dyes can be added to the overcoating layer of a second resist. For use in LFLE, the freezing material can be augmented with dye such that the material simultaneously freezes the first lithographic pattern and provides optical contrast to set up a diffraction grating, diffraction array, alignment array, or other pattern for alignment, making the first pattern itself into an alignment marker. In this manner, the second pattern in a double patterning process can be directly aligned to the first lithographic pattern without having to resort to the use of a surrogate alignment marker, thus greatly improving alignment accuracy in lithography patterning processes such as double patterning processes.

Exemplary alignment system wavelengths in current use are 532 nm, 635 nm, 780 nm, and 850 nm; however, other wavelengths are also possible depending upon a particular type of light or radiation wavelength used in a lithography system. A dye may be selected such that it leaves the performance of the resist at the actinic wavelength unaffected and only impacts the resist transparency at the aligning wavelength.

FIG. 20 shows an exemplary transmission spectrum for photoresist augmented with colored dyes. The spectrum indicates that the dyes are substantially absorbent in specified wavelength bands (which can be selected to correspond to the alignment wavelengths); however, these dyes are substantially transparent at typical actinic wavelengths. In FIG. 20, 2010 is the spectrum for cyan photoresist, 2020, is the spectrum for magenta photoresist, and 2030 is the spectrum for yellow photoresist.

An exemplary dye is Merocyanine 540, which is heavily absorbing at and near 540 nm. The molar extinction coefficient spectrum for Merocyanine 540 is shown in FIG. 21. The chemical structure of Merocyanine 540 is shown below:

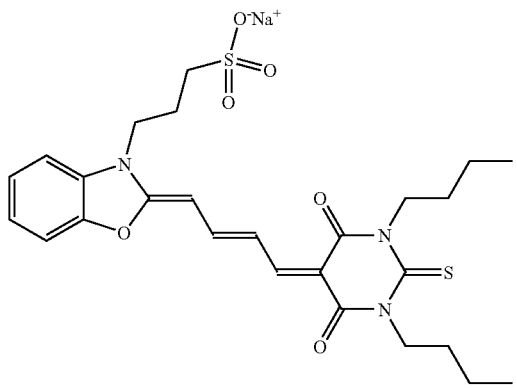

A second exemplary dye is thiatricarbocyanine (also known as C7) dye, which is heavily absorbing at and near 780 nm. The molar extinction coefficient spectrum for C7 is shown in FIG. 22. The chemical structure of C7 is shown below:

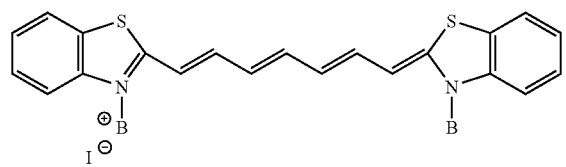

Both of these dyes are transparent at typical actinic wavelengths (for example in the range 220 nm to 400 nm). Other dyes with the properties of being absorbing, fluorescing, or luminescent at typical alignment wavelengths are available. An exemplary dye manufacturer is H.W. Sands Corp., of Jupiter, Fla. For example, other dyes are available that support actinic exposure at 193 nm, 248 nm, 365 nm, 405 nm, and 435 nm, while at the same time are substantially absorbent at typical alignment system wavelengths.

In one embodiment of the present invention, the dye compound comprises a photosensitive compound. In another embodiment of the present invention, the dye compound comprises a photochromic material. Examples of photochromic materials consistent with the present invention are spiropyrans, azobenzenes, photochromic quinones, inorganic photochromic materials, or photochromic complexes of organic chromophores attached to metal ions.

FIG. 23 shows one embodiment of a method of manufacturing a semiconductor device lithographically 2300 consistent with one embodiment of the present invention. In block 2310, a substrate is coated with a first radiation sensitive-layer (e.g., resist). In block 2320, a dye compound is added to the first radiation sensitive-layer. In one embodiment, block 2320 (adding a dye compound) occurs before block 2310 (coating a substrate). In another embodiment, block 2310 (coating a substrate) occurs before block 2320 (adding a dye compound). In block 2330, the first radiation sensitive-layer is exposed and developed to form a first lithography pattern. In one embodiment, block 2330 uses a radiation beam from a lithographic apparatus. In one embodiment, block 2330 (exposure and development) occurs before block 2320 (adding a dye compound); meaning that the dye compound is added to the first lithography pattern. In block 2340, the first lithography pattern is coated with a second radiation-sensitive layer. In block 2350, the location of the first lithography pattern is detected. In one embodiment, this detection is accomplished by an alignment system beam. In block 2360, the substrate is aligned with the detected location of the first lithography pattern. In block, 2370 the second radiation-sensitive layer is exposed and developed to form a second lithography pattern. In one embodiment, block 2370 uses a radiation beam from a lithographic apparatus. Because the substrate is aligned with the first pattern before the second radiation-sensitive layer is exposed, the second lithography pattern is aligned with the first lithography pattern. In one embodiment, the second lithography pattern is aligned interstitially with the first lithography pattern.

In one embodiment of method 2300, the dye compound and the first lithography pattern form a diffraction grating, diffraction array, alignment array, or other pattern for alignment. One embodiment of method 2300 further includes the optional (not shown) step of processing the first lithography pattern before the step 2340 of coating the first lithography pattern with a second radiation-sensitive layer. In one embodiment, this optional processing step comprises freezing the first lithography pattern. In this embodiment, block 2320 (adding a dye compound) can be accomplished by first adding the dye compound to freezing material before the freezing material is applied to the first lithography pattern. In this way, the addition of the freezing material not only freezes the pattern, but it also introduces the dye compound.

In one embodiment of method 2300, the dye compound is fluorescent or luminescent at a desired wavelength band, which may correspond to an alignment system wavelength. In another embodiment, the dye compound is substantially absorbent or substantially reflective at a desired wavelength band, which may correspond to an alignment system wavelength. In one embodiment, the dye compound comprises a photosensitive compound. In another embodiment, the dye compound comprises a photochromic material. Examples of photochromic materials consistent with the present invention are spiropyrans, azobenzenes, photochromic quinones, inorganic photochromic materials, or photochromic complexes of organic chromophores attached to metal ions.

FIG. 24 shows an alternative method of manufacturing a semiconductor device lithographically 2400 consistent with one embodiment of the present invention. The principal difference between methods 2300 and 2400 is that in method 2400, the dye compound is added to the second radiation-sensitive layer, as opposed to the first layer. Therefore, the initial process steps used in traditional double patterning methods remain unchanged because the dye compound is added later in the sequence.

In block 2410, a substrate is coated with a first radiation sensitive-layer (e.g., resist). In block 2420, the first radiation sensitive-layer is exposed and developed to form a first lithography pattern. In one embodiment, block 2420 uses a radiation beam from a lithographic apparatus. In block 2430, the first lithography pattern is coated with a second radiation-sensitive layer. In block 2440, a dye compound is added to the second radiation sensitive-layer. In block 2450, the location of the first lithography pattern is detected. In one embodiment, this detection is accomplished by an alignment system beam. In block 2460, the substrate is aligned with the detected location of the first lithography pattern. In block 2470, the second radiation-sensitive layer is exposed and developed to form a second lithography pattern. In one embodiment, block 2470 uses a radiation beam from a lithographic apparatus. Because the substrate is aligned with the first pattern before the second radiation-sensitive layer is exposed, the second lithography pattern is aligned with the first lithography pattern. In one embodiment, the second lithography pattern is aligned interstitially with the first lithography pattern.

In one embodiment of method 2400, the dye compound and the second lithography pattern form a diffraction grating, diffraction array, alignment array, or other pattern for alignment. One embodiment of method 2400 further includes the optional step (not shown) of processing (for example, freezing) the first lithography pattern before the step 2430 of coating the first lithography pattern with a second radiation-sensitive layer.

In one embodiment of method 2400, the dye compound is fluorescent or luminescent at a desired wavelength band, which may correspond to an alignment system wavelength. In another embodiment, the dye compound is substantially absorbent or substantially reflective at a desired wavelength band, which may correspond to an alignment system wavelength. In one embodiment, the dye compound comprises a photosensitive compound. In another embodiment, the dye compound comprises a photochromic material. Examples of photochromic materials consistent with the present invention are spiropyrans, azobenzenes, photochromic quinones, inorganic photochromic materials, or photochromic complexes of organic chromophores attached to metal ions.

A system for manufacturing a semiconductor device lithographically 2500, consistent with one embodiment of the present invention is shown in FIG. 25. System 2500 includes an illumination source 2510 and an alignment system 2520. Illumination source 2510 provides an alignment beam at a specified wavelength for reading an alignment mark in a double patterning process. Alignment system 2520 is configured to detect a dye compound in one of a first radiation-sensitive layer coated on a substrate or in a second radiation-sensitive layer coated on a first lithography pattern in the double patterning process. The dye compound provides a desired contrast between the first lithography pattern and the second radiation-sensitive layer when aligning two patterning steps of the double patterning process based on the alignment mark formed in the first lithography pattern. In one embodiment, the two patterning steps are aligned interstitially.

It is to be appreciated that a dye compound can be used in any double patterning process, for example in spacer, LELE, LPLE, or LFLE double patterning processes. Referring back to FIGS. 8-11 and FIGS. 13-16, LELE and LFLE both involve a first lithography pattern that is subsequently over coated with a second radiation-sensitive layer (e.g., resist). In some embodiments, the first lithography pattern may have an alignment mark that is produced during the processing steps that created the first pattern. Adding a dye compound to either the first lithography pattern (before or after it is developed and exposed, and before or after the substrate is coated) or the second radiation-sensitive layer provides an optical contrast such that the dye compound cooperates with the first lithography pattern or the second lithography layer to form a diffraction grating, diffraction array, alignment array, or other pattern for alignment. Therefore, the second lithography pattern can be directly aligned to the first lithography pattern very accurately. In some embodiments, the second lithography pattern is aligned interstitially with the first lithography pattern.

Before now, the first pattern was aligned using an alignment marker in a previously processed layer, thereby introducing an associated error. The second pattern was then independently aligned to this alignment marker, introducing the associated error once more. In a worst-case scenario, the errors are large and in the same direction, thereby limiting the optical resolution which can be achieved. Directly aligning the second pattern to an alignment mark defined together with the first pattern eliminates one source of error.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

As used herein, the term "dye compound" is to be broadly construed. A "dye compound" may be any photosensitive compound or any photochromic material. A "dye compound" may also be any compound which is capable of changing relevant optical properties (for example, but not limited to: absorption, reflection, fluorescence, and/or luminescence) such that a pattern or alignment marker formed in a first layer of radiation-sensitive material is detectable even when it is overcoated with a second layer of radiation-sensitive material having similar optical properties to the un-dyed first layer.

The descriptions above are intended to be illustrative, not limiting. Thus, it will be apparent to one skilled in the art that modifications may be made to the invention as described without departing from the scope of the claims set out below.

What is claimed is:

1. A method of manufacturing a semiconductor device lithographically, the method comprising:
    coating a substrate with a first radiation sensitive-layer;
    adding a dye compound below, together with, on, or any combination thereof, the first radiation-sensitive layer;
    exposing and developing the first radiation-sensitive layer to form a first lithography pattern;
    coating the first lithography pattern with a second radiation-sensitive layer;
    detecting the location of the first lithography pattern based on the dye compound;
    aligning the substrate with the detected location of the first lithography pattern; and
    exposing and developing the second radiation-sensitive layer to form a second lithography pattern;
    wherein the second lithography pattern is aligned with the first lithography pattern.

2. The method of manufacturing according to claim 1, further comprising:
    aligning the second lithography pattern interstitially with the first lithography pattern.

3. The method of manufacturing according to claim 1, further comprising:
    forming a diffraction grating, diffraction array, alignment array, or other pattern for alignment from the dye compound and the first lithography pattern.

4. The method of manufacturing according to claim 1, wherein adding the dye compound occurs before coating the substrate.

5. The method of manufacturing according to claim 1, wherein adding the dye compound occurs after coating the substrate and before exposing and developing the first radiation-sensitive layer.

6. The method of manufacturing according to claim 1, wherein adding the dye compound occurs after exposing and developing the first radiation-sensitive layer.

7. The method of manufacturing according to claim 1, further comprising:
    applying freezing material to the first lithography pattern before coating the first lithography pattern with the second radiation-sensitive layer.

8. The method of manufacturing according to claim 1, wherein the dye compound is fluorescent or luminescent at a desired wavelength band.

9. The method of manufacturing according to claim 1, wherein the dye compound is substantially absorbent or substantially reflective at a desired wavelength band.

10. The method of manufacturing according to claim 1, wherein the dye compound comprises one of a photosensitive compound, a photochromic material, or a photochromic material that comprises a spiropyrans, azobenzenes, photochromic quinones, inorganic photochromic materials, or photochromic complexes of organic chromophores attached to metal ions.

11. A method of manufacturing a semiconductor device lithographically, the comprising:
    coating a substrate with a first radiation sensitive-layer;
    exposing and developing the first radiation-sensitive layer to form a first lithography pattern;
    coating the first lithography pattern with a second radiation-sensitive layer;
    adding a dye compound below, together with, on, or any combination thereof, the second radiation-sensitive layer;
    detecting the location of the first lithography pattern based on the dye compound;
    aligning the substrate with the detected location of the first lithography pattern; and
    exposing and developing the second radiation-sensitive layer to form a second lithography pattern;
    wherein the second lithography pattern is aligned with the first lithography pattern.

12. The method of manufacturing according to claim 11, further comprising:
    aligning the second lithography pattern interstitially with the first lithography pattern.

13. The method of manufacturing according to claim 11, further comprising:

forming a diffraction grating, diffraction array, alignment array, or other pattern for alignment from the dye compound and the second lithography pattern.

14. The method of manufacturing according to claim 11, further comprising:
processing the first lithography pattern before coating the first lithography pattern with the second radiation-sensitive layer.

15. The method of manufacturing according to claim 11, wherein the dye compound is one of fluorescent or luminescent at a desired wavelength band or substantially absorbent or substantially reflective at the desired wavelength band.

16. The method of manufacturing according to claim 11, wherein the dye compound comprises one of a photosensitive compound, a photochromic material, or a photochromic material that comprises a spiropyrans, azobenzenes, photochromic quinones, inorganic photochromic materials, or photochromic complexes of organic chromophores attached to metal ions.

17. A system for manufacturing a semiconductor device lithographically, the system comprising:
an illumination source to provide an alignment beam at a specified wavelength for reading an alignment mark in a double patterning process; and
an alignment system configured to detect a dye compound in one of a first radiation sensitive layer coated on a substrate or in a second radiation-sensitive layer coated on a first lithography pattern in the double patterning process;
wherein the dye compound provides a desired contrast between the first lithography pattern and the second radiation-sensitive layer when aligning two patterning steps of the double patterning process to each other based on the alignment mark formed in the first lithography pattern.

18. The system according to claim 17, wherein the second lithography pattern is aligned interstitially with the first lithography pattern.

* * * * *